US011189720B2

(12) United States Patent
Hatta et al.

(10) Patent No.: US 11,189,720 B2
(45) Date of Patent: Nov. 30, 2021

(54) SILICON CARBIDE SEMICONDUCTOR DEVICE AND POWER CONVERTER

(71) Applicant: Mitsubishi Electric Corporation, Chiyoda-ku (JP)

(72) Inventors: Hideyuki Hatta, Tokyo (JP); Shiro Hino, Tokyo (JP); Koji Sadamatsu, Tokyo (JP); Yuichi Nagahisa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 182 days.

(21) Appl. No.: 16/477,099

(22) PCT Filed: Feb. 22, 2018

(86) PCT No.: PCT/JP2018/006439
§ 371 (c)(1),
(2) Date: Jul. 10, 2019

(87) PCT Pub. No.: WO2018/155553
PCT Pub. Date: Aug. 30, 2018

(65) Prior Publication Data
US 2019/0371935 A1     Dec. 5, 2019

(30) Foreign Application Priority Data
Feb. 24, 2017 (JP) .............................. JP2017-033183

(51) Int. Cl.
*H01L 29/78*     (2006.01)
*H01L 29/16*     (2006.01)
(Continued)

(52) U.S. Cl.
CPC ...... *H01L 29/7806* (2013.01); *H01L 29/1608* (2013.01); *H01L 29/41741* (2013.01);
(Continued)

(58) Field of Classification Search
CPC ............. H01L 29/7806; H01L 29/1608; H01L 29/41741; H01L 29/47; H02M 7/53871; H02P 27/08
See application file for complete search history.

(56) References Cited

U.S. PATENT DOCUMENTS

2006/0131645 A1   6/2006  Kaneko
2011/0278599 A1* 11/2011  Nakao .................. H01L 29/1095
                                                             257/77
(Continued)

FOREIGN PATENT DOCUMENTS

JP    2003-17701 A    1/2003
JP    2006-140372 A   6/2006
(Continued)

OTHER PUBLICATIONS

U.S. Appl. No. 16/477,099, filed Jul. 10, 2019, Hideyuki Hatta, et al.

(Continued)

Primary Examiner — Rafael O De Leon Domenech
(74) Attorney, Agent, or Firm — Xsensus LLP

(57) ABSTRACT

In an SiC-MOSFET with a built-in Schottky diode, a bipolar current may be passed in a second well region formed at a terminal part to reduce the breakdown voltage of the terminal part. In the SiC-MOSFET with the built-in Schottky diode, a source electrode forming non-ohmic connection such as Schottky connection with the second well region is provided on the second well region formed below a gate pad in the terminal part. By the absence of ohmic connection between the second well region and the source electrode, reduction in breakdown voltage is suppressed at the terminal part.

16 Claims, 9 Drawing Sheets

(51) Int. Cl.
*H01L 29/417* (2006.01)
*H01L 29/47* (2006.01)
*H02M 7/5387* (2007.01)
*H02P 27/08* (2006.01)

(52) U.S. Cl.
CPC ........ *H01L 29/47* (2013.01); *H02M 7/53871* (2013.01); *H02P 27/08* (2013.01)

(56) References Cited

U.S. PATENT DOCUMENTS

| | | | |
|---|---|---|---|
| 2012/0057386 A1 | 3/2012 | Adachi et al. | |
| 2012/0205669 A1* | 8/2012 | Miura | H01L 29/66068 257/77 |
| 2013/0020587 A1 | 1/2013 | Hino et al. | |
| 2014/0152374 A1 | 6/2014 | Adachi et al. | |
| 2014/0225114 A1* | 8/2014 | Furukawa | H01L 27/0296 257/48 |
| 2014/0252378 A1 | 9/2014 | Ota et al. | |
| 2015/0236012 A1 | 8/2015 | Hino et al. | |
| 2015/0349051 A1* | 12/2015 | Uchida | H01L 29/0619 257/77 |
| 2016/0020276 A1* | 1/2016 | Lu | H01L 29/0649 257/77 |
| 2016/0079411 A1 | 3/2016 | Hino et al. | |
| 2017/0077087 A1* | 3/2017 | Horikawa | H01L 29/7804 |

FOREIGN PATENT DOCUMENTS

| | | |
|---|---|---|
| JP | 2014-175412 A | 9/2014 |
| JP | 2015-211159 A | 11/2015 |
| WO | WO 2010/125819 A1 | 11/2010 |
| WO | WO 2011/125274 A1 | 10/2011 |
| WO | WO 2014/038110 A1 | 3/2014 |
| WO | WO 2014/162969 A1 | 10/2014 |

OTHER PUBLICATIONS

U.S. Appl. No. 16/477,119, filed Jul. 10, 2019, Yuichi Nagahisa, et al.

International Search Report dated May 22, 2018 in PCT/JP2018/006439 filed on Feb. 22, 2018.

Notice of Reasons for Refusal dated Sep. 18, 2018 in Japanese Patent Application No. 2018-536897 (with English language translation).

* cited by examiner

SILICON CARBIDE SEMICONDUCTOR DEVICE AND POWER CONVERTER

TECHNICAL FIELD

The present invention relates to a silicon carbide semiconductor device made of silicon carbide and a power converter.

BACKGROUND ART

Regarding a PN diode configured using silicon carbide (SiC), flowing a forward current, specifically, a bipolar current continuously is known to result in a problem in terms of reliability that stacking fault is caused in crystal to cause the forward voltage to shift. This is considered to result from the extension of the stacking fault as plane defect from basal plane dislocation as a starting point existing in a silicon carbide substrate, for example, caused by rebinding energy produced when minority carriers injected through the PN diode are recombined with majority carriers. This stacking fault prohibits a current flow. Hence, the extension of the stacking fault reduces current and increases the forward voltage, causing reliability reduction of a semiconductor device.

Such increase in the forward voltage also occurs in a similar way in a vertical metal oxide semiconductor field effect transistor (MOSFET) using silicon carbide. The vertical MOSFET includes a parasitic PN diode (body diode) between a source and a drain. If a forward current flows in the body diode, the vertical MOSFET also suffers from reliability reduction similar to that occurring in the PN diode. If the body diode of the SiC-MOSFET is used as a free-wheeling diode of an MOSFET, the characteristics of this MOSFET may be degraded.

There is one method of solving the foregoing problem in terms of reliability caused by the passage of the forward current in the parasitic PN diode. As shown in patent document 1, according to this method, stress of causing a forward current to flow for a long time in the parasitic PN diode is applied, change is measured between a forward voltage before the stress application and a forward voltage after the stress application, and an element with large change in the forward voltage is eliminated (screen out) from products. However, this method has disadvantages that time of current passage is extended, and using a wafer with many defects results in the occurrence of many defective items.

There is also a different method by which a unipolar diode is provided and used as a free-wheeling diode in a semiconductor device as a unipolar transistor such as an MOSFET. For example, patent documents 2 and 3 each describe a method of providing a Schottky barrier diode (SBD) as a unipolar diode in a unit cell of an MOSFET.

Regarding such a unipolar transistor including a unipolar diode, specifically, a diode to pass a current only with majority carriers provided in an active region, if this unipolar transistor is applied to an SiC semiconductor device, designing a diffusion potential at the unipolar transistor, specifically, a voltage for starting current passage to be lower than a diffusion potential at a PN junction prevents flow of a bipolar current in the body diode during free-wheeling operation. By doing so, it becomes possible to suppress characteristic degradation of the unipolar transistor in the active region.

Even in the unipolar transistor with the unipolar diode provided in the active region, however, formation of a parasitic PN diode is still unavoidable in some cases in a part where the unipolar diode is hard to locate for reason of a structure in a terminal region, namely, a region other than the active region.

For example, a terminal well region protruding further outwardly than a source electrode is formed in a region near a gate pad or near a semiconductor device terminal part, and a parasitic PN diode is formed between the terminal well region and a drift layer. In this part, a Schottky electrode is not formed and a unipolar diode is not formed. By the absence of a Schottky electrode in the terminal well region, a voltage between a source electrode and a drain electrode is applied to the PN diode formed from the terminal well region and the drift layer. As a result, a bipolar current flows in the PN diode.

If a starting point such as basal plane dislocation exists in this part, stacking fault is extended, unfortunately reducing the breakdown voltage of a transistor. More specifically, a leakage current may occur when the transistor is in an OFF state, and heat generated from the leakage current may destroy an element or a circuit.

This problem may be avoided by limiting a voltage applied between a source and a drain to a certain value or less so as to prevent flow of a bipolar current in the PN diode formed from the terminal well region and the drift layer. This may be achieved by increasing a chip size and reducing a source-to-drain voltage generated at the time of flow of a free-wheeling current. This causes a disadvantage as it increases the chip size and increases cost.

The forward operation of the PN diode formed from the terminal well region and the drift layer may be suppressed without increasing the chip size by a method of increasing a resistance at a current passage path formed between each part in the terminal well region and a source electrode. A resistance at the current passage path may be increased by a method of increasing a contact resistance between the terminal well region and the source electrode (patent document 4, for example). In such a structure, when a bipolar current flows in the PN diode formed from the terminal well region and the drift layer, voltage drop develops as a result of the foregoing resistance component to produce a difference of a potential at the terminal well region from a source potential. This generates corresponding reduction in a forward voltage applied to the PN diode. In this way, it becomes possible to suppress passage of a bipolar current.

PRIOR ART DOCUMENTS

Patent Documents

Patent document 1: Japanese Patent Application Laid-Open No. 2014-175412
Patent document 2: Japanese Patent Application Laid-Open No. 2003-017701
Patent document 3: Publication of International Application No. WO 2014-038110
Patent document 4: Publication of International Application No. WO 2014-162969

SUMMARY

Problem to be Solved by the Invention

Even if the contact resistance between the terminal well region and the source electrode is increased, however, providing the terminal well region with an electrode in ohmic connection with the source electrode makes it impossible to increase a resistance at the current passage path sufficiently formed between the terminal well region and the source electrode. In some cases, this has made it impossible to reduce passage of a bipolar current in the terminal well region sufficiently.

The present invention has been made to solve the foregoing problems, and is intended to provide a silicon carbide semiconductor device with reliability improved by suppressing flow of a bipolar current in a terminal well region more reliably.

Means to Solve the Problem

A silicon carbide semiconductor device according to the present invention includes: a semiconductor substrate of a first conductivity type made of silicon carbide; a drift layer of the first conductivity type formed on the semiconductor substrate; a first well region of a second conductivity type provided in a surface layer of the drift layer; a first separation region of the first conductivity type penetrating the first well region in a depth direction from a surface layer of the first well region; a source region of the first conductivity type formed in a surface layer area of the first well region; a first Schottky electrode provided on the first separation region and forming a Schottky junction with the first separation region; an ohmic electrode provided on the first well region; a second well region of the second conductivity type provided in the surface layer of the drift layer separately from the first well region; a gate insulating film formed on the first well region; a gate electrode formed on the gate insulating film on the first well region; a gate pad formed above the second well region and connected with the gate electrode; and a source electrode connected with the first Schottky electrode and the ohmic electrode and not in ohmic connection with the second well region.

Effects of the Invention

In the silicon carbide semiconductor device according to the present invention, flow of a bipolar current in the terminal well region is suppressed further to achieve improved reliability.

DESCRIPTION OF EMBODIMENT(S)

Figure 1:
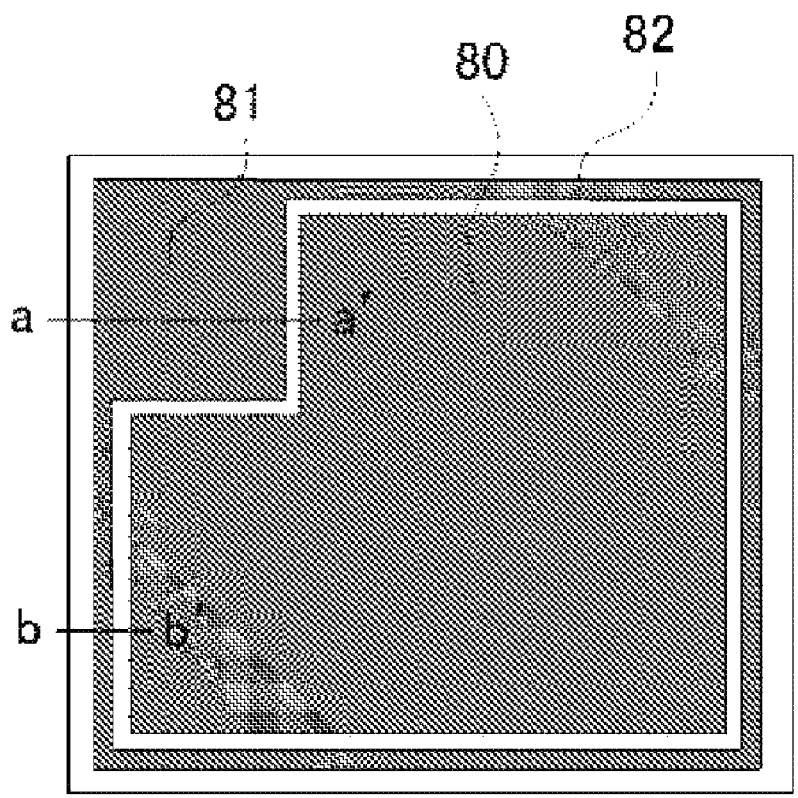
FIG. 1 is a schematic plan view of a silicon carbide semiconductor device taken from above according to a first embodiment of the invention.

Embodiments will be described below by referring to the accompanying drawings. The drawings are drawn schematically. Correlations in terms of size and position between images shown in different drawings are not always illustrated correctly but can be changed, where appropriate. In the following description, comparable constituting elements are given the same sign and shown with the same sign in the drawings. The names and functions of such constituting elements are correlated to each other in the same way. Thus, in some cases, detailed description of such constituting elements will be omitted.

In embodiments described in this description, a silicon carbide (SiC) semiconductor device is given as an example of a semiconductor device, and an n-channel silicon carbide MOSFET having an n type as a first conductivity type and a p type as a second conductivity type is described as an example. Statement about a potential level is based on the assumption that the first conductivity type is the n type and the second conductivity type is the p type. If the first conductivity type is the p type and the second conductivity type is the n type, statement about a potential level is to be considered in an opposite way.

In this application, a region belonging to the semiconductor device entirely and other than an active region where unit cells are aligned cyclically will be called a terminal region and described with this name.

In the embodiments given in this description, an MOSFET including a Schottky junction formed in an active region is described as an example. Meanwhile, if a reverse current is to be passed in a channel region of the MOSFET during free-wheeling operation, a corresponding structure and corresponding operation will also apply to the terminal region.

First Embodiment

The structure of a silicon carbide semiconductor device according to a first embodiment of the present invention will be described first.

FIG. 1 is a schematic plan view of a silicon carbide MOSFET with a built-in Schottky diode (SBD) (SiC-MOSFET with built-in SBD) as the silicon carbide semiconductor device taken from above according to the first embodiment. In FIG. 1, a gate pad 81 is formed in a part of the upper surface of the SiC-MOSFET, and a source electrode 80 is formed adjacent to the gate pad 81. A gate line 82 is formed to extend from the gate pad 81.

Figure 2:
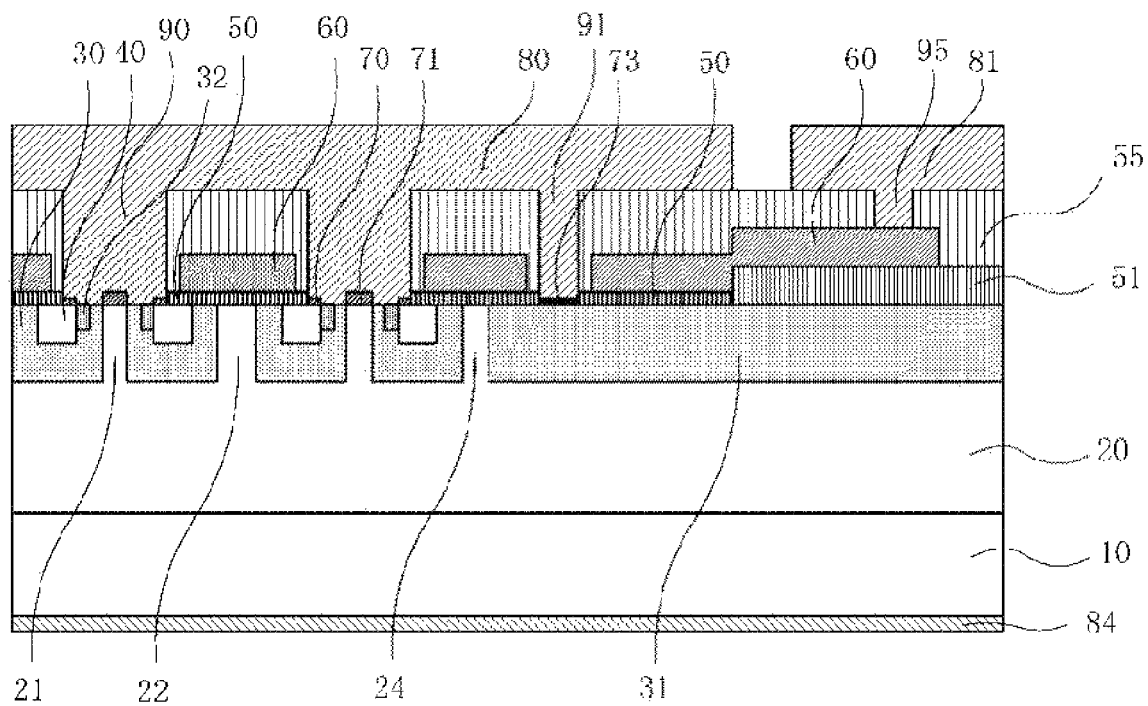
FIG. 2 is a schematic sectional view of the silicon carbide semiconductor device according to the first embodiment of the invention.
Figure 3:
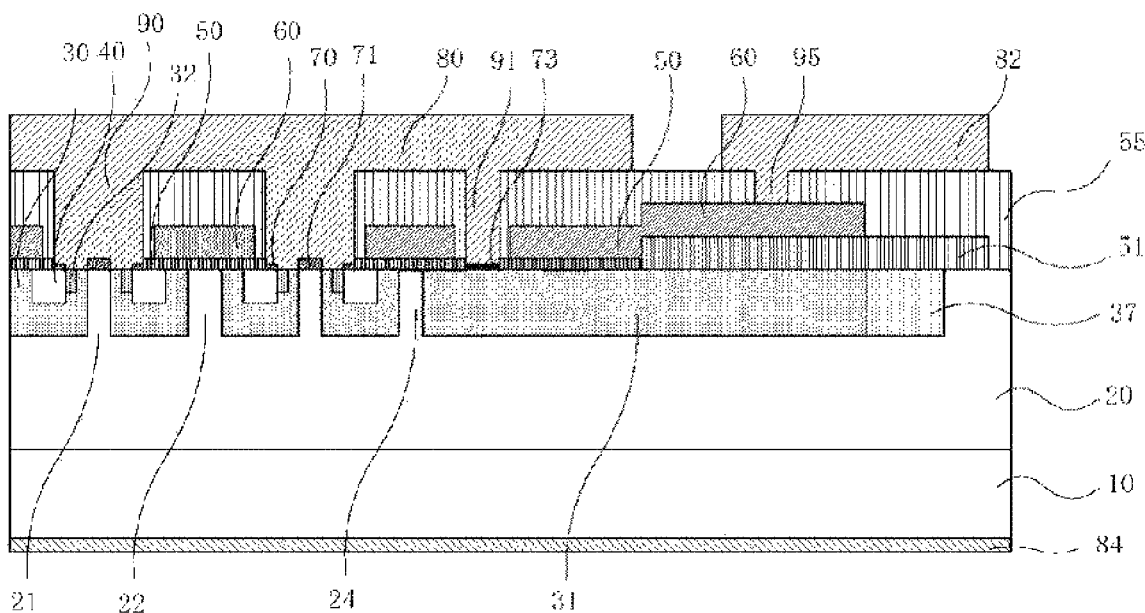
FIG. 3 is a schematic sectional view of the silicon carbide semiconductor device according to the first embodiment of the invention.
Figure 4:
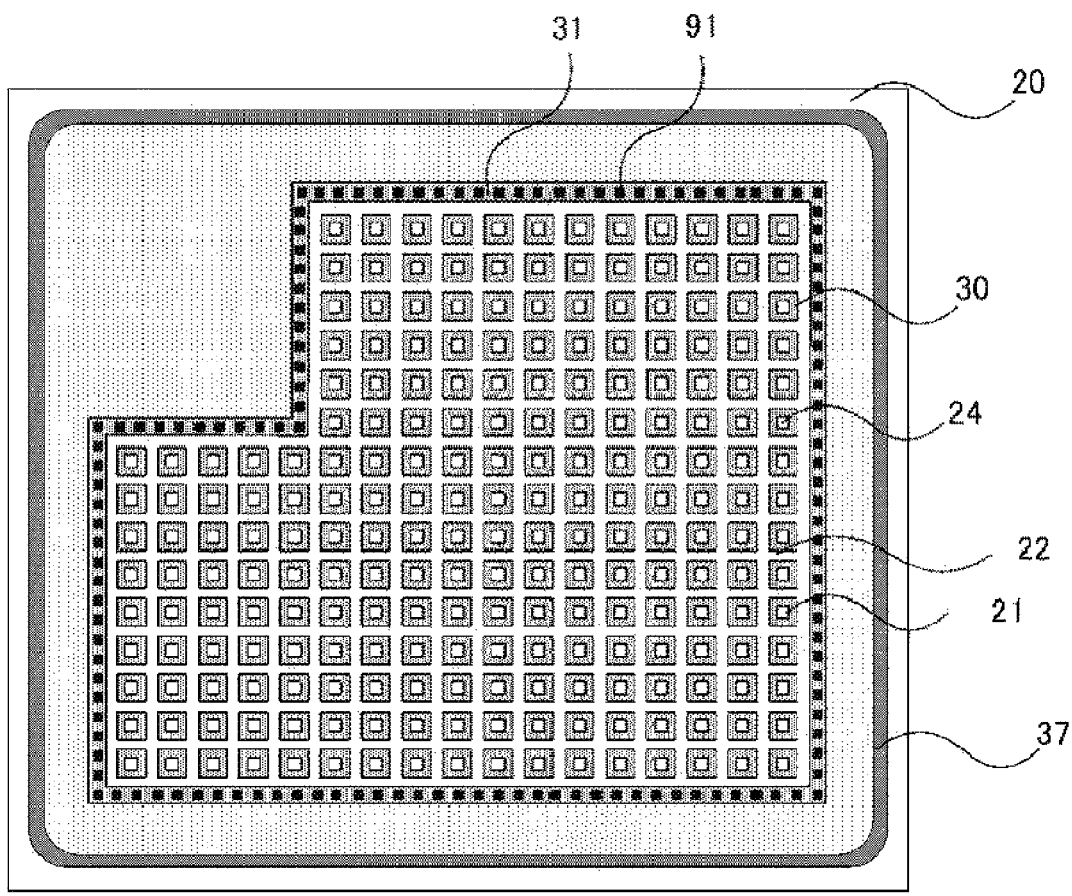
FIG. 4 is a schematic plan view of the silicon carbide semiconductor device according to the first embodiment of the invention.

FIG. 2 is a schematic sectional view schematically showing a cross section in a part a-a' of FIG. 1 from the gate pad 81 to the source electrode 80. FIG. 3 is a schematic sectional view schematically showing a cross section in a part b-b' of FIG. 1 from the source electrode 80 to the gate line 82 in an outer peripheral part of the silicon carbide semiconductor device. FIG. 4 is a schematic plan view mainly showing a part corresponding to silicon carbide semiconductor in the top view of FIG. 1.

In FIGS. 2 and 3, a drift layer 20 made of n-type silicon carbide is formed on a surface of a semiconductor substrate 10 made of n-type and low-resistance silicon carbide. As shown in FIG. 4, a second well region 31 made of p-type silicon carbide is formed in a surface layer area of the drift layer 20 at a position substantially corresponding to a region where the gate pad 81 described by referring to FIG. 1 is provided. Specifically, the gate pad 81 is formed above the second well region 31.

Multiple first well regions 30 made of p-type silicon carbide are provided in the surface layer area of the drift layer 20 and below a region where the source electrode 80 described by referring to FIG. 1 is provided. Each of the first well regions 30 has a surface layer area where a source region 40 made of n-type silicon carbide is formed at a position separated inwardly by a predetermined gap from the outer periphery of the first well region 30.

A contact region 32 made of low-resistance p-type silicon carbide is formed in the surface layer area of the first well region 30 at a position further separated inwardly from the source region 40 in the surface layer area of each first well region 30. A first separation region 21 made of silicon carbide and penetrating the first well region 30 is formed still inside the contact region 32. Like the drift layer 20, the first separation region 21 has the n type and has the same impurity concentration as the drift layer 20.

A first Schottky electrode 71 in Schottky connection with the first separation region 21 is formed on a surface of the first separation region 21.

An ohmic electrode 70 is formed on a surface of the source region 40. The source electrode 80 connected with the ohmic electrode 70, the first Schottky electrode 71, and the contact region 32 is formed on the surface of the source region 40.

A region in the drift layer 20 between adjacent ones of the first well regions 30 functions as a second separation region 22. Like the drift layer 20, the second separation region 22 has the n type and has the same impurity concentration as the drift layer 20. A gate insulating film 50 is formed on surfaces of the adjacent first well regions 30, a surface of the second separation region 22 between the adjacent first well regions 30, and a surface of the source region 40 in each first well region 30. A gate electrode 60 is formed on the gate insulating film 50 and at least above the first well region 30. The surface layer area of the first well region 30 below a part where the gate electrode 60 is formed and facing the gate electrode 60 across the gate insulating film 50 will be called a channel region.

The second well region 31 is formed outside the first well region 30 at the outermost periphery of the silicon carbide semiconductor device. A fourth separation region 24 is formed between the first well region 30 and the second well region 31. Like the drift layer 20, the fourth separation region 24 has the n type and has a similar impurity concentration to the drift layer 20.

The gate insulating film 50 or a field insulating film 51 having a larger thickness than the gate insulating film 50 is formed on a surface of the second well region 31. The gate insulating film 50 or the field insulating film 51 on the surface of the second well region 31 is partially given an opening. A second Schottky electrode 73 in Schottky connection with the second well region 31 is formed in the opening. The source electrode 80 connected with the ohmic electrode 70, etc. is formed on the second Schottky electrode 73.

An interlayer insulating film 55 is formed between the gate electrode 60 and the source electrode 80. In FIG. 2, the gate electrode 60 and the gate pad 81 above the second well region 31 are connected with each other through a gate contact hole 95 formed in the interlayer insulating film 55. In FIG. 3, the gate electrode 60 and the gate line 82 above the second well region 31 are connected with each other through the gate contact hole 95 formed in the interlayer insulating film 55. A p-type JTE region 37 made of silicon carbide is formed on the outer periphery of the second well region 31, specifically, on the opposite side of the first well region 30. The JTE region 37 has a lower impurity concentration than the second well region 31.

Next, a method of manufacturing the SiC-MOSFET with built-in SBD as the silicon carbide semiconductor device of this embodiment will be described.

First, the drift layer 20 made of silicon carbide having an impurity concentration from $1\times10^{15}$ to $1\times10^{17}$ cm$^{-3}$, n-type, and a thickness from 5 to 50 μm is epitaxially grown by chemical vapor deposition process (CVD process) on the semiconductor substrate 10 having a first main surface of a plane direction (0001) with an off angle and 4H polytype, and made of n-type and low-resistance silicon carbide.

Next, an implantation mask is formed using a photoresist, for example, in a predetermined region on the surface of the drift layer 20, and aluminum (Al) as p-type impurities is ion-implanted. At this time, the depth of the ion implantation with Al is set in a range from about 0.5 to about 3 μm not exceeding the thickness of the drift layer 20. The impurity concentration of the ion-implanted Al is a second impurity concentration in a range from $1\times10^{17}$ to $1\times10^{19}$ cm$^{-3}$, which is higher than a first impurity concentration in the drift layer 20. Then, the implantation mask is removed. As a result of this step, the region ion-implanted with Al becomes the first well region 30.

Likewise, an implantation mask is formed using a photoresist, for example, on the surface of the drift layer 20, and Al as p-type impurities is ion-implanted. At this time, the depth of the ion implantation with Al is set in a range from about 0.5 to about 3 μm not exceeding the thickness of the drift layer 20. The impurity concentration of the ion-implanted Al is in a range from $1\times10^{16}$ to $1\times10^{18}$ cm$^{-3}$, which is higher than the first impurity concentration in the drift layer 20 and lower than the second impurity concentration in the first well region 30. Then, the implantation mask is removed. As a result of this step, the region ion-implanted with Al becomes the second well region 31.

Next, an implantation mask is formed using a photoresist, for example, on the surface of the drift layer 20, and Al as p-type impurities is ion-implanted. At this time, the depth of the ion implantation with Al is set in a range from about 0.5 to about 3 μm not exceeding the thickness of the drift layer 20. The impurity concentration of the ion-implanted Al is in a range from $1\times10^{16}$ to $1\times10^{18}$ $cm^{-3}$, which is higher than the first impurity concentration in the drift layer 20 and lower than the second impurity concentration in the first well region 30. Then, the implantation mask is removed. As a result of this step, the region ion-implanted with Al becomes the JTE region 37.

Next, an implantation mask is formed using a photoresist, for example, so as to form an opening at a predetermined position inside the first well region 30 in the surface of the drift layer 20. Then, nitrogen (N) as n-type impurities is ion implanted. The depth of the ion implantation with N is set to be smaller than the thickness of the first well region 30. The impurity concentration of the ion-implanted N is in a range from $1\times10^{18}$ to $1\times10^{21}$ $cm^{-3}$, which exceeds the p-type second impurity concentration in the first well region 30. A region in the region implanted with N in this step and exhibiting the n type becomes the source region 40.

Next, a thermal processing device performs annealing in an atmosphere of inert gas such as argon (Ar) gas, at a temperature from 1300 to 1900° C., and in a duration from 30 seconds to one hour. As a result of this annealing, the ion implanted N and Al are electrically activated.

Then, by the use of CVD process or photolithography technique, for example, the field insulating film 51 made of silicon oxide having a thickness from 0.5 to 2 μm is formed on the semiconductor layer in a region other an active region substantially corresponding to a region where the first well region 30 is formed. At this time, the field insulating film 51 may be formed on the entire surface, and then the field insulating film 51 at a position substantially corresponding to the active region may be removed by photolithography technique or etching, for example.

Next, a surface of the silicon carbide uncovered by the field insulating film 51 is thermally oxidized to form a silicon oxide film as the gate insulating film 50 having an intended thickness. A polycrystalline silicon film having conductivity is thereafter formed by low pressure CVD process on the gate insulating film 50 and the field insulating film 51 and then patterned, thereby forming the gate electrode 60. Next, the interlayer insulating film 55 made of silicon oxide is formed by low pressure CVD process. Then, a first contact hole 90 is formed to penetrate the interlayer insulating film 55 and the gate insulating film 50 and reach the contact region 32 and the source region 40 in the active region. At the same time, a second contact hole 91 is formed to reach the second well region 31.

Next, a metal film mainly containing Ni is formed by sputtering process, for example. Then, the metal film is subjected to thermal process at a temperature from 600 to 1100° C. to make the metal film mainly containing Ni react with the silicon carbide layer in the first contact hole 90, thereby forming silicide between the silicon carbide layer and the metal film. Next, the residual metal film other than the silicide resulting from the reaction is removed by wet etching. By doing so, the ohmic electrode 70 is formed.

Then, a metal film mainly containing Ni is formed on the back surface (second main surface) of the semiconductor substrate 10 and thermally processed, thereby forming a back surface ohmic electrode (not shown in the drawings) on the back side of the semiconductor substrate 10.

A next step is patterning using a photoresist, for example, to remove the interlayer insulating film 55 on the first separation region 21 and remove the interlayer insulating film 55 at positions where the gate insulating film 50 and the gate contact hole 95 are to be formed. The interlayer insulating film 55 may be removed by a wet etching method not to cause damage on the surface of the silicon carbide layer to become a Schottky interface.

Then, a metal film to become a Schottky electrode is deposited by sputtering process, for example. Patterning is performed using a photoresist, for example, thereby forming the second Schottky electrode 73 on the first separation region 21 in the first contact hole 90 and on the second well region 31 in the second contact hole 91.

Next, wiring metal such as Al is formed by sputtering process or deposition process on the surface of the substrate having been processed, and processed into a predetermined shape by photolithography technique, thereby forming the source electrode 80 contacting the ohmic electrode 70, the first Schottky electrode 71, and the second Schottky electrode 73 belonging to the source side, and the gate pad 81 and the gate line 82 contacting the gate electrode 60.

Further, a drain electrode 84 as a metal film is formed on a surface of the back surface ohmic electrode formed on the back surface of the substrate. As a result, formation of the silicon carbide semiconductor device of this embodiment shown in FIGS. 1 to 4 is completed.

Next, the operation of the SiC-MOSFET with built-in SBD as the silicon carbide semiconductor device of this embodiment will be described. In this example, a semiconductor material is 4H-type silicon carbide. In this case, a diffusion potential at a pn junction is substantially 2 V.

Free-wheeling operation will be considered first. In the free-wheeling operation, a drain voltage (a voltage at the drain electrode 84) is lower than a source voltage (a voltage at the source electrode 80) to generate a voltage of several volts between the source and the drain. In the presence of the source electrode 80 in ohmic connection with the second well region 31 through the ohmic electrode 70, much of the source-to-drain voltage is applied to the pn junction between the second well region 31 and the drift layer 20, thereby causing a bipolar current to flow in a pn diode formed from the second well region 31 and the drift layer 20.

Meanwhile, like in this embodiment, if ohmic connection is absent between the second well region 31 and the source electrode 80 and the second well region 31 and the source electrode 80 are Schottky connected with each other through the second Schottky electrode 73, much of the source-to-drain voltage is applied to the Schottky junction between the second Schottky electrode 73 on the second well region 31 and the second well region 31. This achieves reduction in a voltage to be applied to the pn junction formed from the second well region 31 and the drift layer 20.

By setting a voltage to be applied to the pn junction to be lower than 2 V corresponding to the diffusion potential at the pn junction, it becomes possible to suppress flow of a bipolar current in the pn diode. More specifically, by setting a voltage, determined by subtracting a voltage generated at the Schottky junction between the second Schottky electrode 73 and the second well region 31 from the voltage generated between the source and the drain, to be lower than the diffusion potential at the pn junction, it becomes possible to suppress a bipolar current flowing in the pn junction of the pn diode.

With a voltage generated between the source and the drain at 5 V, for example, designing the reverse breakdown voltage of the Schottky junction formed from the second Schottky electrode 73 on the second well region 31 and the second well region 31 to be 3 V or more makes it possible to make a forward voltage applied to the pn junction formed from the second well region 31 and the drift layer 20 less than 2 V. By doing so, passage of a forward current in the pn diode in this region can be prevented.

Even if the breakdown voltage of the Schottky junction formed between the second Schottky electrode 73 on the second well region 31 and the second well region 31 falls below the foregoing value, as long as ohmic connection is absent between the second well region 31 and the source electrode 80 and the second well region 31 and the second Schottky electrode 73 are Schottky connected with each other, a voltage to be applied to the pn junction formed from the second well region 31 and the drift layer 20 can still be reduced. This achieves certain effect of reducing a bipolar current in the pn diode and reducing probability of failure.

A switching state will be considered next by describing turn-on operation as an example. As described above, a potential at the drain electrode 84 decreases steeply during a turn-on period to inject holes from the source electrode 80 into the second well region 31 through the second Schottky electrode 73, thereby causing a displacement current to flow in a chip plane direction. At this time, the displacement current generated in the second well region 31 passes through the Schottky junction formed from the second Schottky electrode 73 and the second well region 31. Thus, compared to a voltage in the presence of ohmic connection between the source electrode 80 and the second well region 31, a voltage resulting from the displacement current is increased by a voltage corresponding to the breakdown voltage of the Schottky junction formed from the second Schottky electrode 73 and the second well region 31.

A Schottky diode formed from the second Schottky electrode 73 and the second well region 31 is configured to breakdown. A voltage causing the breakdown may be from about 10 to about 20 V.

Thus, design should be made in such a manner that a voltage, determined by adding a voltage at the second well region 31 that increases at a position separated from the second Schottky electrode 73 in a plane direction to the breakdown voltage of the Schottky diode formed from the second Schottky electrode 73 and the second well region 31, becomes lower than the insulation breakdown voltage of the insulating film held between the gate pad 81, the gate line 82 or the gate electrode 60 at a gate potential and the second well region 31.

In many cases, the gate insulating film 50 of the MOSFET made of silicon carbide is generally formed using silicon oxide of a thickness from about 30 to about 100 nm. Assuming that the gate insulating film 50 has a thickness of 50 nm, the insulation breakdown voltage of the gate insulating film 50 becomes about 50 V in consideration of the insulation breakdown field of silicon oxide, which is about 10 mV/cm. Thus, in the presence of the gate insulating film 50 formed between the second well region 31 and the gate electrode 60, a voltage to be generated in the second well region 31 is required to be set at 50 V or less. Additionally, application of a high electric field exceeding a half of the insulation breakdown field to the silicon oxide film may cause a risk of reliability reduction. Thus, a voltage to be generated in the second well region 31 is more desirably set at a half of the insulation breakdown voltage of the gate insulating film 50 or less, specifically, at 25 V or less.

As described above, in the absence of ohmic connection between the second well region 31 and the source electrode 80, the second Schottky electrode 73 is formed therebetween to form the Schottky junction from the second well region 31 and the second Schottky electrode 73. The breakdown voltage of the Schottky junction is designed to be larger than a value determined by subtracting a diffusion potential at the pn junction from a voltage generated between the source and the drain during the free-wheeling operation and to be smaller than the breakdown voltage of the insulating film formed on the second well region 31, more desirably, to be a half of the breakdown voltage or less. By doing so, it becomes possible to reduce the occurrence of breakdown of the insulating film during switching operation while suppressing passage of a current in the pn diode at the second well region 31 during the free-wheeling operation.

Figure 5:
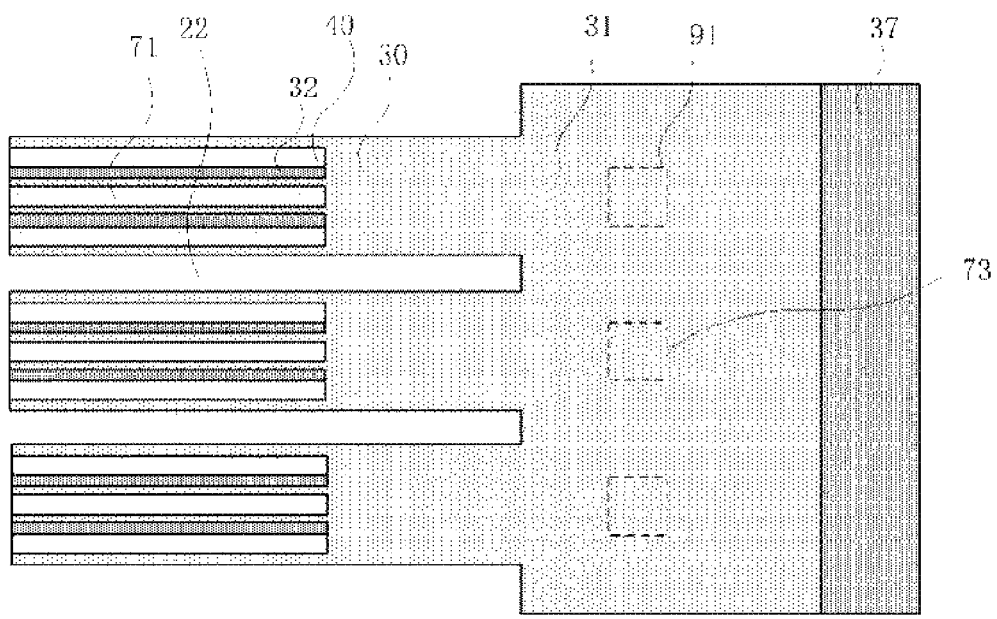
FIG. 5 is a schematic plan view of the silicon carbide semiconductor device according to the first embodiment of the invention.

In this embodiment, the first well region 30 and the second well region 31 are described as being separated from each other. Alternatively, the first well region 30 and the second well region 31 may be continuous with each other. Additionally, while the first well region 30 is described as including multiple first well regions 30 and the multiple first well regions 30 are described as being separated from each other, the multiple first well regions 30 may be continuous with each other. FIG. 5 is a schematic plan view showing the first well region 30 and the second well region 31 continuous with each other and the multiple first well regions 30 continuous with each other. In this case, the first well region 30 is at a distance of 50 μm or less either from the source region 40 in the first well region 30 or from the first Schottky electrode 71 formed on the first separation region 21 in the first well region 30.

From a different viewpoint, the second well region 31 is required to be electrically isolated from the source electrode at the time of voltage application during the free-wheeling operation. It is assumed, for example, that a bipolar current of a current density J (A/cm$^2$) flows in a well region of the second conductivity type in a region having an area S (cm$^2$) and formed at a position separated from the source electrode during the free-wheeling operation. In this case, assuming that a resistance value in a path between the region of the area S and the source electrode is $R_{tot}$ (Ω) and a potential at the source electrode is 0 V, a potential $V_{drop}$ (V) at this region is expressed as $V_{drop}=J \times S \times R_{tot}$.

In this well region, with a drain voltage set at about 4 V, for example, if $V_{drop}$ becomes about 2 V or more, a voltage determined by subtracting $V_{drop}$ from the drain voltage becomes about 2 V or less corresponding to a diffusion potential at a pn junction in SiC. In this case, a current to cause expansion of stacking fault does not flow in this well region. Thus, in such a case, even if this well region is located in what is called a terminal region directly below the gate pad 81 or the gate line 82 or near such a position, and this well region is at the foregoing distance of not exceeding 50 μm from either the source region 40 or the first Schottky electrode 71, the well region in such a position will be called the second well region 31 in this description.

As shown in the schematic plan view of FIG. 5, for example, a wide well region directly below the gate pad 81 may be connected with the first well region 30 formed into a comb-like pattern in a plan view, a contact in ohmic connection with the source electrode 80 may not be formed in the wide well region, and a contact in ohmic connection with the source electrode 80 may be formed in the first well region 30 in the comb-like pattern. In this case, a wide well region at a distance exceeding 50 μm from the source electrode 80 in the first well region 30 in the comb-like pattern nearest the wide well region becomes the second well region 31. Likewise, a wide well region at a distance exceeding 50 μm from the first Schottky electrode 71 in the first well region 30 in the comb-like pattern becomes the second well region 31. The first well region 30 in the comb-like pattern includes the source electrode 80 and the first Schottky electrode 71. A region at a distance both from the source electrode 80 and the first Schottky electrode 71 becomes the second well region 31.

In addition to the foregoing limitation, limitation is also imposed by a resistance value in a path from a predetermined well region to the source electrode 80. It is assumed that there is a region of 10 μm×10 μm where a free-wheeling current flows at a current density of 5 A/cm$^2$ and a resistance value in a path from this region to the source electrode 80 is 400 kΩ. In this case, the foregoing $V_{drop}$ (V) is calculated as 2 V. With a drain voltage of 4 V, a value determined by subtracting $V_{drop}$ from the drain voltage becomes smaller than a diffusion potential at a pn junction to allow suppression of bipolar operation during the free-wheeling operation. Thus, this region becomes the second well region 31. If the drain voltage becomes larger than 4 V to be 5 V, a part having $V_{drop}$ (V) of 3 V corresponding to this voltage increase becomes the second well region 31.

In the example described in this embodiment, the ion implantations are performed in predetermined order. However, the order of the ion implantations may be changed, where appropriate. Further, the order of forming the ohmic electrode 70 on the back surface, the ohmic electrode 70 on the front surface, and the first Schottky electrode 71 (second Schottky electrode 73) may be changed, where appropriate.

In this embodiment, the first separation region 21 is described as having the same n type as the drift layer 20 and having the same impurity concentration as the drift layer 20. However, the n-type impurity concentration in the first separation region 21 may be higher than the n-type impurity concentration in the drift layer 20. This statement about the first separation region 21 also applies to the second separation region 22 and the fourth separation region 24.

In the example described in this embodiment, the MOSFET with built-in SBD is provided in the active region. Meanwhile, the MOSFET with built-in SBD may be replaced by an MOSFET in which an n-type channel epitaxial layer is formed on a p-type well region, the channel epitaxial layer operates as a unipolar diode at a gate voltage being a threshold voltage or less, and the start-up voltage of the unipolar diode is designed to be lower than the operating voltage of a pn diode formed from the p-type well region and an n-type drift layer. Even in such a case of reverse passage of a current in a channel region in the MOSFET during the free-wheeling operation, effect comparable to that achieved by the MOSFET with built-in SBD is still achieved.

Second Embodiment

In the example described in the first embodiment, the second well region is in Schottky connection with the second Schottky electrode 73. In a second embodiment, a conductive region of the first conductivity type is provided in a surface layer area of the second well region, and ohmic connection of the conductive region with the source electrode is formed through a second ohmic electrode provided on the conductive region and in ohmic connection with the conductive region. The conductive region of the first conductivity type and the second well region of the second conductivity type form a pn junction. The other structure of the second embodiment will not be described in detail as it is the same as that in the first embodiment.

Figure 6:
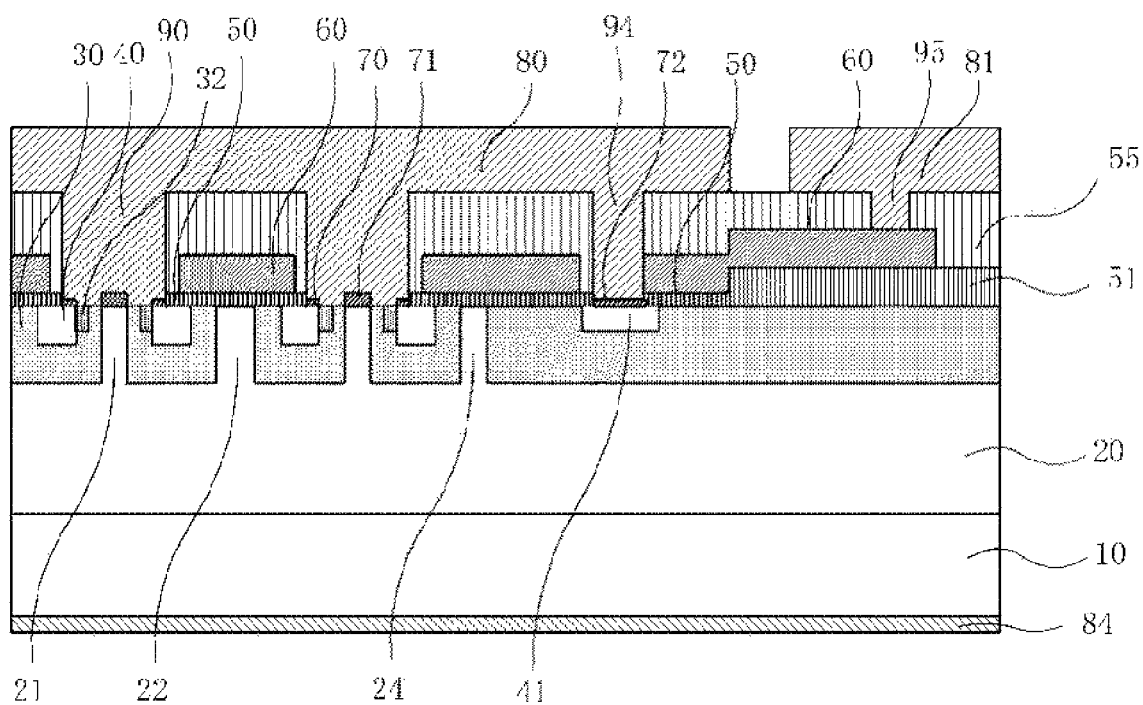
FIG. 6 is a schematic sectional view of a silicon carbide semiconductor device according to a second embodiment of the invention.
Figure 7:
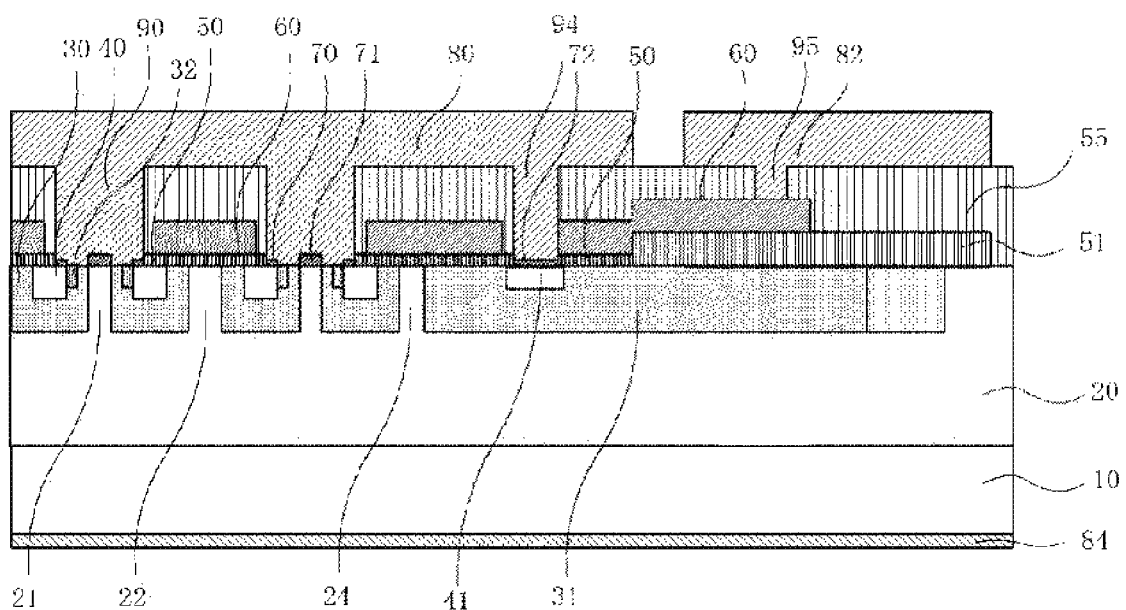
FIG. 7 is a schematic sectional view of the silicon carbide semiconductor device according to the second embodiment of the invention.

FIG. 6 is a schematic sectional view of a silicon carbide semiconductor device of this embodiment schematically showing a cross section in the part a-a' from the gate pad 81 to the source electrode 80 in FIG. 1 referred to in the description of the first embodiment. FIG. 7 is a schematic sectional view of the silicon carbide semiconductor device of this embodiment schematically showing a cross section in the part b-b' from the source electrode 80 to an outer peripheral part of an element in FIG. 1.

In FIGS. 6 and 7, a conductive region 41 of the first conductivity type is formed in the surface layer area of the second well region 31, and a fourth contact hole 94 penetrating the interlayer insulating film 55, etc. to reach the conductive region 41 is formed on the conductive region 41. The conductive region 41 is not in ohmic connection with the second well region 31. A second ohmic electrode 72 in ohmic connection with the conductive region 41 is formed in the fourth contact hole 94, and the second ohmic electrode 72 is connected with the source electrode 80.

The conductive region 41 is made of silicon carbide. An impurity concentration of the first conductivity type impurity in the conductive region 41 may be in a range from $1 \times 10^{17}$ to $1 \times 10^{19}$ cm$^{-3}$, for example. The thickness of the conductive region 41 may be from 50 to 1000 nm, for example. The conductive region 41 may be formed to be wider than the range of the fourth contact hole 94.

The conductive region 41 of the first conductivity type and the second well region 31 of the second conductivity type form a pn junction. This pn junctions functions in the same way as the Schottky junction of the first embodiment formed between the second well region 31 and the second Schottky electrode 73.

The pn junction formed between the conductive region 41 and the second well region 31 is configured to breakdown during a turn-on period when a reverse bias is applied.

Thus, like the silicon carbide semiconductor device of the first embodiment, the silicon carbide semiconductor device of this embodiment can suppress flow of a bipolar current in a pn junction of a pn diode formed between the second well region 31 and the drift layer 20 to achieve high reliability.

The conductive region 41 and the second ohmic electrode 72 may be formed in different steps from those for forming the other structures. Alternatively, the conductive region 41 may be formed in the same step as the source region 40 in the active region, and the second ohmic electrode 72 may be formed in the same step as the ohmic electrode 70 in the active region. By doing so, manufacturing process is simplified to allow cost reduction.

Third Embodiment

In the example described in the first embodiment, an impurity concentration in the second well region 31 in a plane direction is constant. In a third embodiment, the surface layer area of the second well region 31 includes a region where an impurity concentration is higher than a part where the second well region 31 contacts the second Schottky electrode 73. The other structure of the third embodiment will not be described in detail as it is the same as that in the first embodiment.

Figure 8:
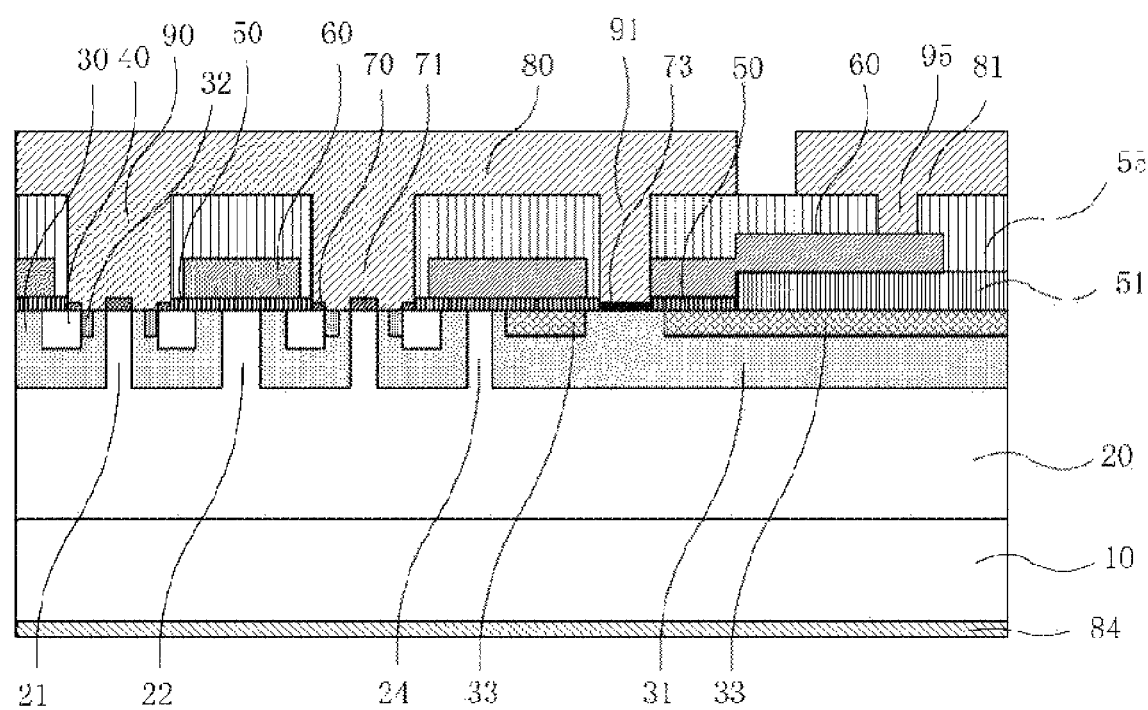
FIG. 8 is a schematic sectional view of a silicon carbide semiconductor device according to a third embodiment of the invention.
Figure 9:
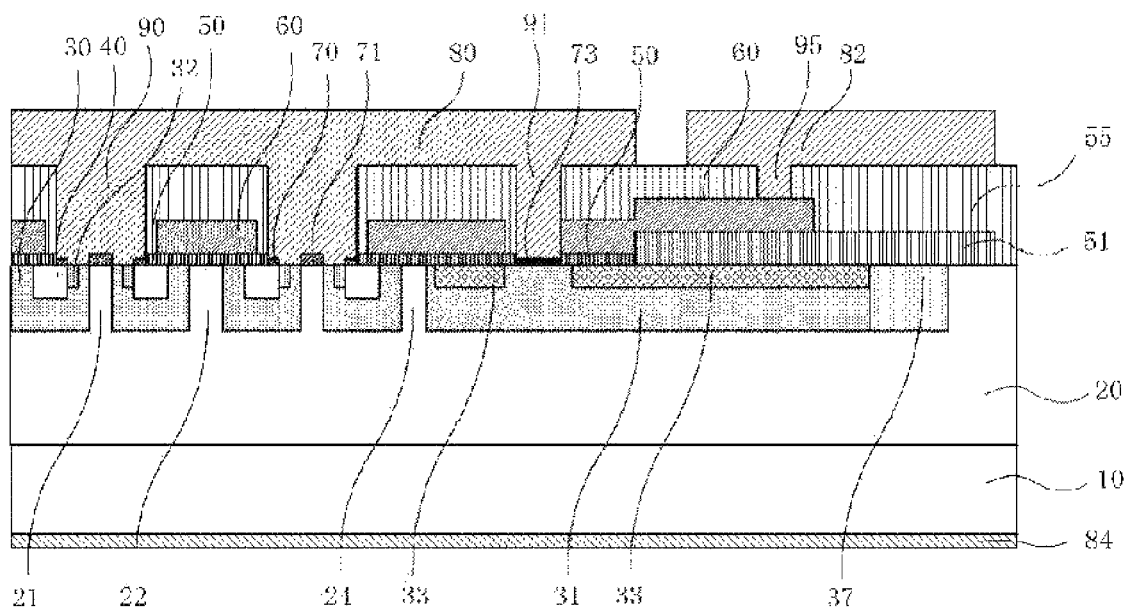
FIG. 9 is a schematic sectional view of the silicon carbide semiconductor device according to the third embodiment of the invention.

FIG. 8 is a schematic sectional view of a silicon carbide semiconductor device of this embodiment schematically showing a cross section in the part a-a' from the gate pad 81 to the source electrode 80 in FIG. 1 referred to in the description of the first embodiment. FIG. 9 is a schematic sectional view of the silicon carbide semiconductor device of this embodiment schematically showing a cross section in the part b-b' from the source electrode 80 to an outer peripheral part of an element in FIG. 1.

Figure 10:
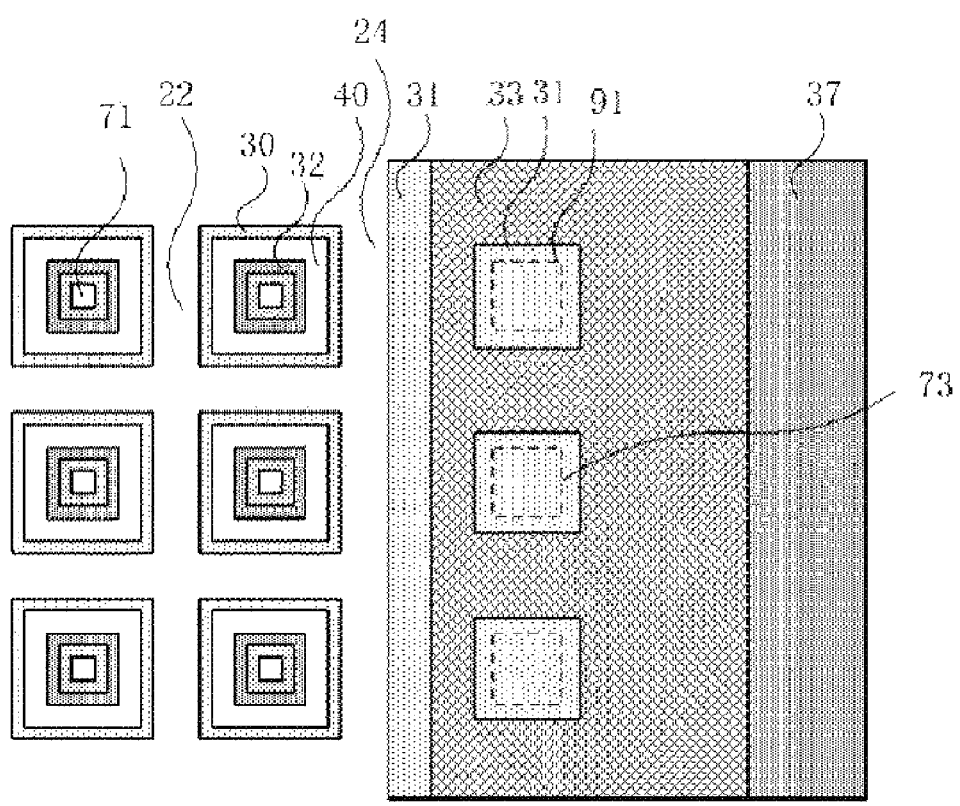
FIG. 10 is a schematic plan view of the silicon carbide semiconductor device according to the third embodiment of the invention.

FIG. 10 is a schematic plan view showing a terminal well region in the silicon carbide semiconductor device of this embodiment in an enlarged manner.

In FIGS. 8 and 9, a part of the surface layer area of the second well region 31 in the absence of the second Schottky electrode 73 includes a high-concentration region 33 of the second conductivity type having a higher impurity concentration of the second conductivity type than the second well region 31. The impurity concentration of the second conductivity type in the high-concentration region 33 may be in a range from $1 \times 10^{18}$ to $1 \times 10^{20}$ cm$^{-3}$, for example. The thickness of the high-concentration region 33 is smaller than that of the second well region 31 and may be in a range from 0.1 to 1 µm, for example. In the plan view of FIG. 10, the high-concentration region 33 is formed so as to surround the second Schottky electrode 73 formed on the second well region 31.

The following describes a problem of how a displacement current causes breakdown of an element in a device made of a wide-gap semiconductor represented by silicon carbide.

When a silicon carbide semiconductor device having an MOS structure is switched, a displacement current flows in a lateral direction in a cross section in a terminal well region. This displacement current and a sheet resistance in the terminal well region cause variation in a potential at the terminal well region. If a potential at the terminal well region is changed to 50 V or more and if a gate oxide film of a thickness of 50 nm and a gate electrode at substantially 0 V are formed on the terminal well region, for example, a high electric field such as 10 MV/cm is applied to the gate oxide film to result in an unintentional breakdown of the gate oxide film.

This problem characteristically occurs in the device made of a wide-gap semiconductor represented by silicon carbide. This is caused by the following two reasons. A first reason is that, as a well region formed in silicon carbide has a deeper impurity level in an impurity region such as the well region than a well region of silicon, a sheet resistance is increased significantly. The other reason is that, as a low-resistance drift layer is used in a wide-gap semiconductor by taking advantage of the insulation breakdown field of the wide-gap semiconductor higher than that of a silicon semiconductor, a high impurity concentration is designed for the drift layer. This results in significant increase in the capacity of a depletion layer between a source and a drain. As a result, a large displacement current occurs during switching.

As a switching speed becomes higher, a displacement current becomes larger and a voltage generated at the terminal well region also becomes larger. This problem may be avoided by reducing the switching speed. However, this causes unintentional switching loss.

Reducing a resistance between each part in the terminal well region and the source electrode may be effective in avoiding element breakdown during switching without the need of reducing the switching speed. For example, a contact resistance between the terminal well region and the source electrode may be reduced, or a sheet resistance in the terminal well region may be reduced.

In comparison to the first embodiment, the low-resistance high-concentration region 33 of the second conductivity type is formed in the surface layer area of the second well region 31 in this embodiment, as shown in the schematic sectional views of FIGS. 8 and 9.

By doing so, positive charge to move in the second well region 31 is allowed to move easily, thereby suppressing a voltage to be generated during switching. Thus, the occurrence of insulation breakdown of the gate insulating film 50 formed on the second well region 31 is reduced, thereby contributing to reliability improvement.

Figure 11:
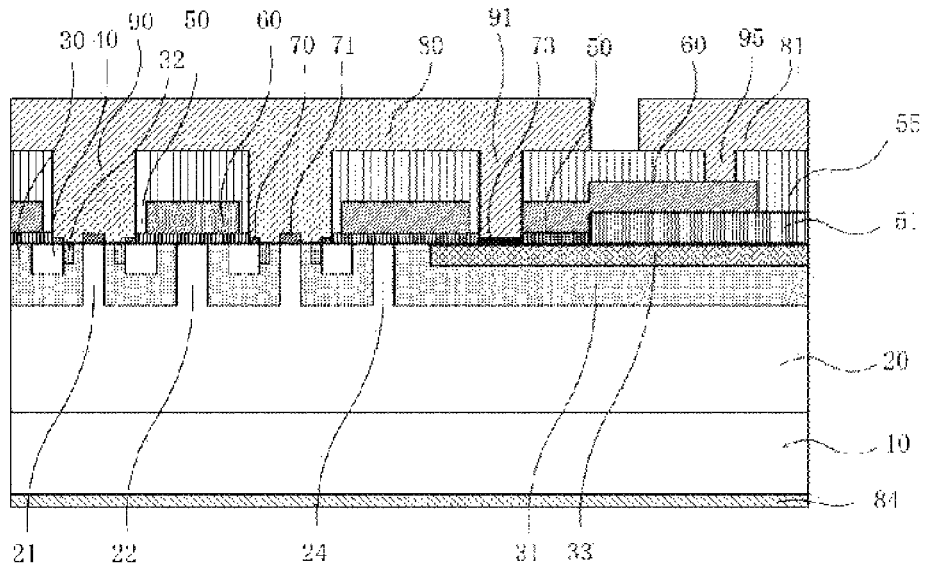
FIG. 11 is a schematic sectional view of the silicon carbide semiconductor device according to the third embodiment of the invention.

In FIGS. 8 to 10, the high-concentration region 33 is formed only around the second Schottky electrode 73. Meanwhile, as long as the second Schottky electrode 73 and the high-concentration region 33 are joined through Schottky connection, the high-concentration region 33 may be formed directly below the second Schottky electrode 73. FIG. 11 is a schematic sectional view showing an example of the silicon carbide semiconductor device having such a structure. In this case, the impurity concentration of the second conductivity type impurity in the high-concentration region 33 may be set in a range from $5 \times 10^{17}$ to $5 \times 10^{18}$ cm$^{-3}$, for example.

Figure 12:
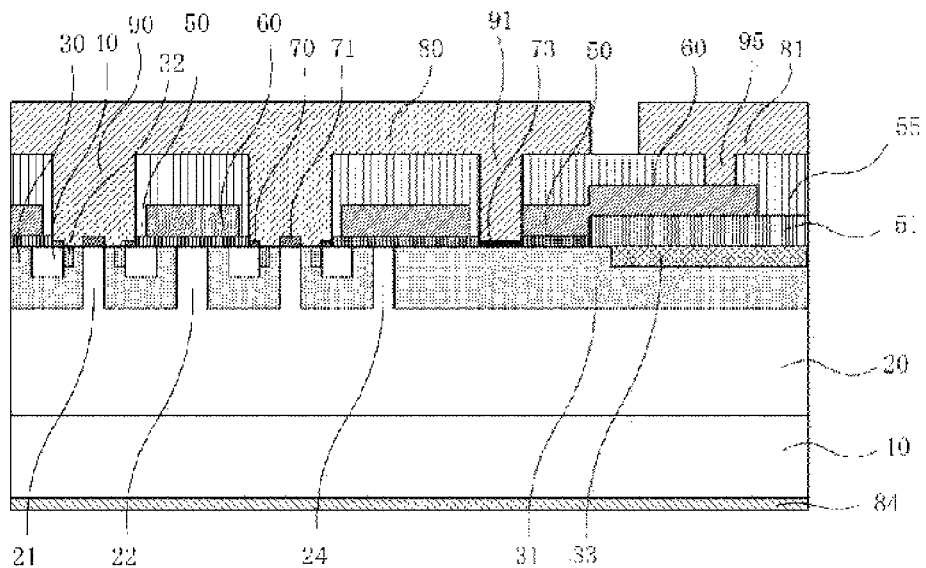
FIG. 12 is a schematic sectional view of the silicon carbide semiconductor device according to the third embodiment of the invention.

In FIGS. 8 to 11, the high-concentration region 33 is formed to extend further to an area under the gate insulating film 50 on which the gate electrode 60 is formed. Meanwhile, as shown in the schematic sectional view of FIG. 12, the high-concentration region 33 may be formed so as not to extend to the area under the gate insulating film 50 on which the gate electrode 60 is formed.

This makes it possible to suppress the probability of application of a high voltage to the gate insulating film 50 directly below the gate electrode 60.

The high-concentration region 33 of this embodiment is applicable to the second embodiment.

Fourth Embodiment

In the examples described in the first to third embodiments, a Schottky electrode for the drift layer 20 is not provided in the second well region 31. In a silicon carbide semiconductor device of a fourth embodiment, a separation region of the first conductivity type is provided in the second well region 31, and a Schottky electrode for the separation region of the first conductivity type is provided on this separation region. The other structure of the fourth embodiment will not be described in detail as it is the same as those in the first and second embodiments.

Figure 13:
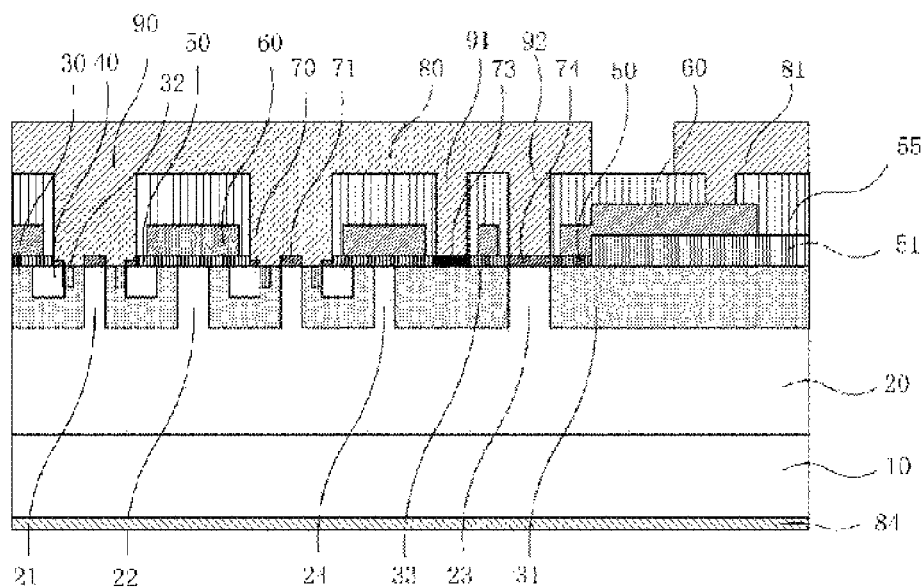
FIG. 13 is a schematic sectional view of a silicon carbide semiconductor device according to a fourth embodiment of the invention.
Figure 14:
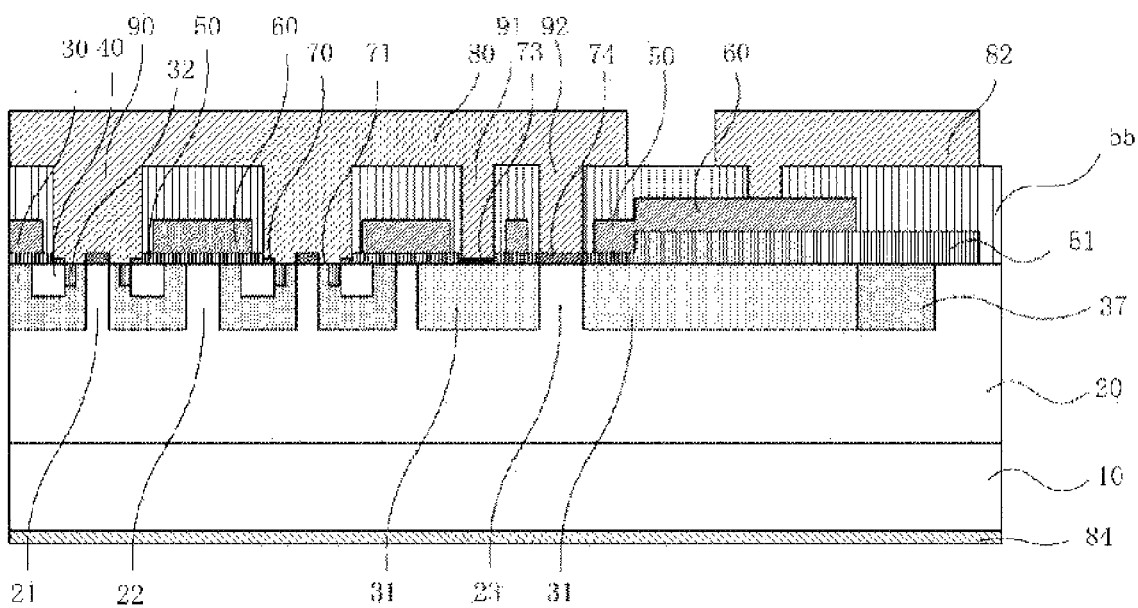
FIG. 14 is a schematic sectional view of the silicon carbide semiconductor device according to the fourth embodiment of the invention.
Figure 15:
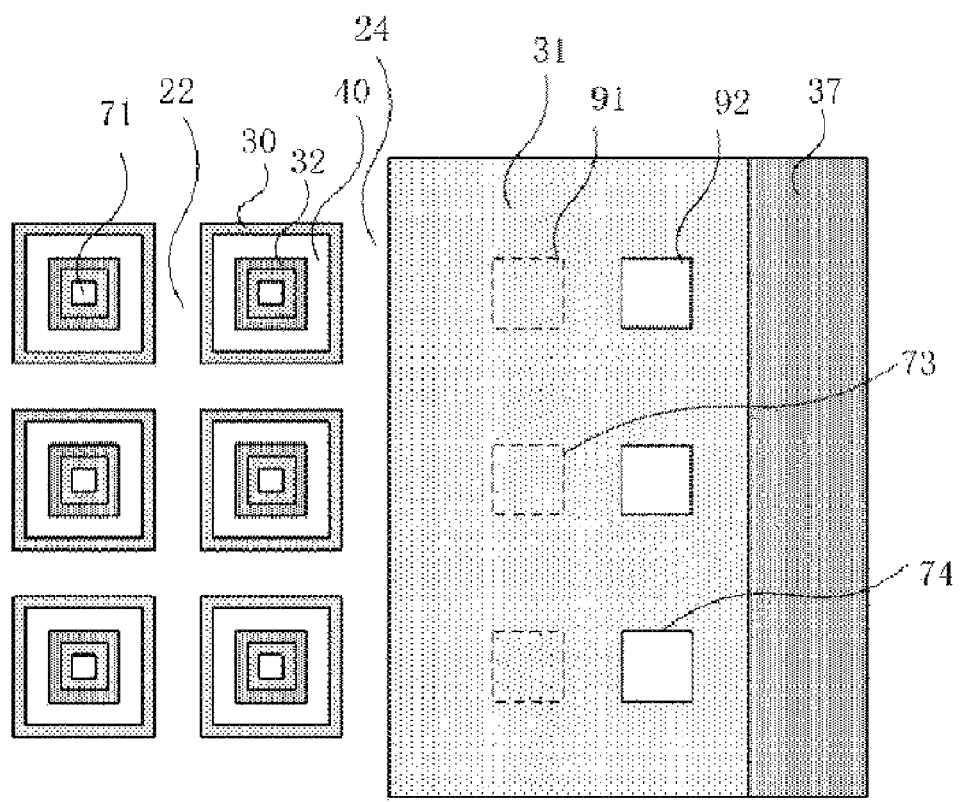
FIG. 15 is a schematic plan view of the silicon carbide semiconductor device according to the fourth embodiment of the invention.

FIG. 13 is a schematic sectional view of a silicon carbide semiconductor device of this embodiment schematically showing a cross section in the part a-a' from the gate pad 81 to the source electrode 80 in FIG. 1 referred to in the description of the first embodiment. FIG. 14 is a schematic sectional view of the silicon carbide semiconductor device of this embodiment schematically showing a cross section in the part b-b' from the source electrode 80 to an outer peripheral part of an element in FIG. 1. FIG. 15 is a schematic plan view showing a terminal well region in the silicon carbide semiconductor device of this embodiment in an enlarged manner.

In FIGS. 13 and 14, a third separation region 23 of the first conductivity type is formed in the second well region 31, and a third Schottky electrode 74 in Schottky connection with the third separation region 23 of the first conductivity type is formed on the third separation region 23. The third Schottky electrode 74 is formed in a third contact hole 92 formed in the gate insulating film 50 and the interlayer insulating film 55 and is connected with the source electrode 80 through the third contact hole 92.

In FIG. 15, multiple third separation regions 23 are formed separately from each other outside multiple second Schottky electrodes 73 formed separately from each other on the second well region 31, and the third Schottky electrode 74 is formed in the third contact hole 92 on the third separation region.

In the silicon carbide semiconductor device having the foregoing structure, a current passing through the second Schottky electrode 73 formed on the second well region 31 and a current passing from the third separation region 23 through the third Schottky electrode 74 flow between the source electrode 80 and the drain electrode 84 during free-wheeling operation. This can further reduce a voltage to be applied to the pn junction between the second well region 31 and the drift layer 20, allowing suppression of the passage of a bipolar current. As a result, element reliability can be improved.

In this embodiment, a Schottky diode on the third separation region 23 in the second well region may have a junction barrier Schottky (JBS) diode structure with multiple third separation regions 23.

The high-concentration region 33 described in the third embodiment can certainly be formed in the second well region 31 in the silicon carbide semiconductor device of this embodiment.

Fifth Embodiment

In the examples described in the first to fourth embodiments, Schottky connection or a pn junction is formed between the second well region 31 and the source electrode 80. In a silicon carbide semiconductor device of a fifth embodiment, a second conductive region of the first conductivity type is formed in the second well region 31, and a second high-concentration region 36 of the second conductivity type is formed in the second conductive region 45. The other structure of the fifth embodiment will not be described in detail as it is the same as those in the first and second embodiments.

Figure 16:
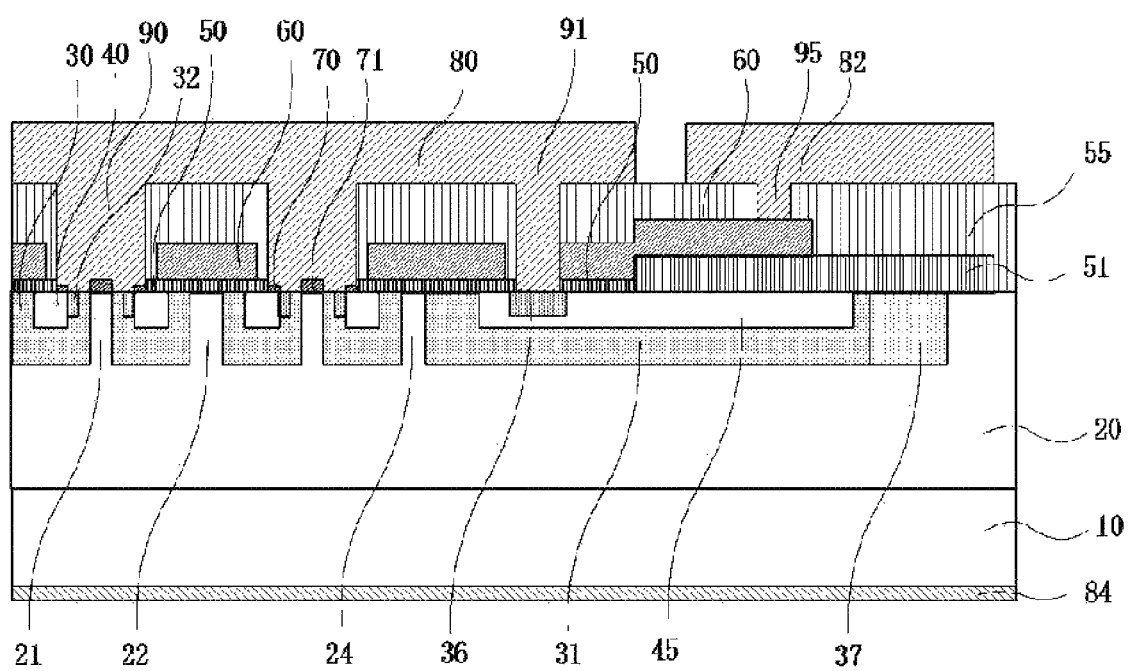
FIG. 16 is a schematic sectional view of a silicon carbide semiconductor device according to a fifth embodiment of the invention.

In this embodiment, as shown in the schematic sectional view of FIG. 16, the second high-concentration region 36 of the second conductivity type and the second conductive region 45 of the first conductivity type are formed between the second well region 31 and the source electrode 80. The second high-concentration region 36 and the source electrode 80 are in ohmic connection with each other. Here, the second conductive region 45 is formed to be placed between the second high-concentration region 36 and the second well region 31. More specifically, the second well region 31, the second conductive region 45, and the second high-concentration region 36 form a p/n/p structure.

The p/n/p structure formed from the second well region 31, the second conductive region 45, and the second high-concentration region 36 is a structure to breakdown, namely, a structure in which a current is to flow. A third ohmic electrode for ohmic connection may be formed between the second high-concentration region 36 and the source electrode 80.

The foregoing structure makes it possible to increase a breakdown voltage in a terminal region during free-wheeling operation, compared to a structure such as that of the first embodiment where the second well region and the source electrode 80 are in Schottky connection. This makes it possible to increase a bipolar operating voltage in the terminal region to allow further increase in a unipolar current to flow in an active region of an element. As a result, the area of the active region necessary for flowing a predetermined diode current can be reduced to allow reduction in the area of a chip. In this way, the cost of the chip can be reduced.

In the structure of this embodiment, a breakdown voltage as a bipolar operating voltage can be changed by adjusting the second high-concentration region 36 or the second conductive region 45 in terms of an impurity concentration, an impurity concentration profile in a depth direction, or a width in a lateral direction in a cross section. Specifically, adjustment can be made easily to achieve intended breakdown characteristics.

In the descriptions given in the first to fifth embodiments, the first conductivity type is the n type and the second conductivity type is the p type. However, conductivity types are not limited to these. Comparable effect is still achieved with the first conductivity type being the p type and the second conductivity type being the n type. Additionally, while N is used as the n-type (first conductivity type) impurities, phosphorus or arsenic is also applicable. While Al is used as the p-type (second conductivity type) impurities, boron or gallium is also applicable.

The MOSFET with built-in SBD of any of the first to fifth embodiments may be replaced by an MOSFET in which an n-type channel epitaxial layer 49 is formed on a p-type well region, the channel epitaxial layer 49 operates as a unipolar diode at a gate voltage being a threshold voltage or less, and the start-up voltage of the unipolar diode is designed to be lower than the operating voltage of a pn diode formed from the p-type well region and an n-type drift layer. This MOSFET also achieves effects comparable to those of the first to fourth embodiments.

In the MOSFET described in any of the first to fifth embodiments, the gate insulating film 50 is not always required to be an oxide film such as $SiO_2$ but it may also be an insulating film other than an oxide film, or a combination of an insulating film other than an oxide film and an oxide film. While silicon oxide resulting from thermal oxidation of silicon carbide is used for forming the gate insulating film 50, the gate insulating film 50 may also be made of silicon oxide in a deposited film formed by CVD process. Further, the present invention is also applicable to an MOSFET having a super junction structure.

The device described in any of the foregoing embodiments is the MOSFET with the gate insulating film 50. Meanwhile, the present invention is applicable to any unipolar device. For example, the present invention is further applicable to a junction FET (JFET) or a metal-semiconductor field effect transistor (MESFET) without the gate insulating film 50.

While the ohmic electrode 70 and the first Schottky electrode 71 belonging to the source side are prepared separately in the foregoing embodiments, they may be formed continuously using the same material or may be formed continuously using different materials.

The first Schottky electrode 71 and the second Schottky electrode 73 may be formed using the same material or different materials.

In the foregoing embodiments, various examples have been given for describing a crystal structure, a plane direction of a main surface, an off angle, a condition for each implantation, etc. However, applicability should not be limited to the numerical ranges given in these examples.

Sixth Embodiment

In a sixth embodiment, the silicon carbide semiconductor device according to any of the first to fifth embodiments is applied to a power converter. While the applicability of the present invention is not limited to a particular power converter, the present invention described in the following sixth embodiment is applied to a three-phase inverter.

Figure 17:
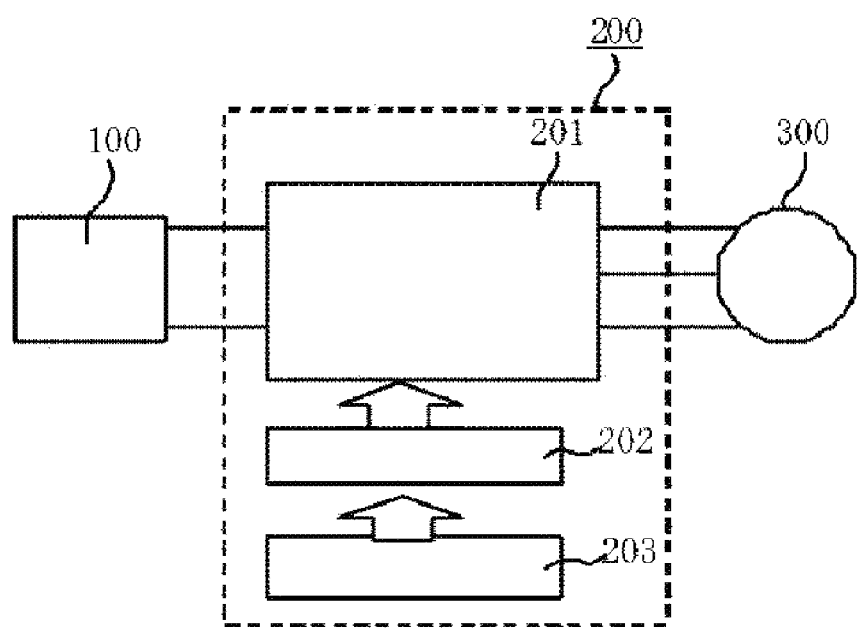
FIG. 17 is a schematic view showing the structure of a power converter according to a sixth embodiment of the invention.

FIG. 17 is a block diagram showing the structure of a power converter system using the power converter according to this embodiment.

The power converter system shown in FIG. 17 includes a power supply 100, a power converter 200, and a load 300. The power supply 100 is a DC power supply and supplies DC power to the power converter 200. The power supply 100 can be configured using various types of power supplies. For example, the power supply 100 can be configured using a DC system, a solar cell, a battery, or a rectifier circuit or an AC/DC converter connected with an AC system. The power supply 100 may also be configured using a DC/DC converter that converts DC power output from a DC system to predetermined power.

The power converter 200 is a three-phase inverter connected between the power supply 100 and the load 300. The power converter 200 converts DC power supplied from the power supply 100 to AC power, and supplies the AC power to the load 300. As shown in FIG. 17, the power converter 200 includes a main converter circuit 201 that converts DC power to AC power and outputs the AC power, a drive circuit 202 that outputs a drive signal for driving each switching element in the main converter circuit 201, and a control circuit 203 that outputs a control signal for controlling the drive circuit 202 to the drive circuit 202.

The load 300 is a three-phase motor driven by the AC power supplied from the power converter 200. The load 300 is not limited to particular purpose but is a motor installed on various types of electrical equipment. For example, the load 300 is used as a motor for a hybrid vehicle or an electric vehicle, a railway vehicle, an elevator, or an air conditioner.

The power converter 200 will be described in detail below. The main converter circuit 201 includes a switching element and a free-wheeling diode (not shown in the drawings). By the switching of the switching element, DC power supplied from the power supply 100 is converted to AC power, and the AC power is supplied to the load 300. Various specific circuit configurations are applicable to the main converter circuit 201. Among those, the main converter circuit 201 according to this embodiment is a two-level three-phase full-bridge circuit that can be configured using six switching elements, and six free-wheeling diodes connected inverse-parallel to corresponding ones of the switching elements. The silicon carbide semiconductor device according to any one of the foregoing first to sixth embodiments is applied to each switching element in the main converter circuit 201. Two switching elements of the six switching elements are connected in series to form an upper arm and a lower arm. Each upper arm and a corresponding lower arm form each phase (U phase, V phase, W phase) of the full-bridge circuit. An output terminal of each upper arm and a corresponding lower arm, namely, three output terminals of the main converter circuit 201 are connected with the load 300.

The drive circuit 202 generates a drive signal for driving a switching element in the main converter circuit 201, and supplies the generated drive signal to a control electrode of the switching element in the main converter circuit 201. More specifically, in response to a control signal from the control circuit 203 described later, the drive circuit 202 outputs a drive signal for bringing the switching element in an ON state and a drive signal for bringing the switching element in an OFF state to the control electrode of the switching element. To maintain the switching element in the ON state, the drive signal is a voltage signal (ON signal) at the threshold voltage of the switching element or more. To maintain the switching element in the OFF state, the drive signal is a voltage signal (OFF signal) at the threshold voltage of the switching element or less.

The control circuit 203 controls a switching element in the main converter circuit 201 so as to supply intended power to the load 300. More specifically, the control circuit 203 calculates time (ON time) when each switching element in the main converter circuit 201 is to be in the ON state based on the power to be supplied to the load 300. For example, the control circuit 203 can control the main converter circuit 201 by means of PWM control of modulating the ON time of the switching element in response to a voltage to be output. Then, the control circuit 203 outputs a control command (control signal) to the drive circuit 202 so as to output an ON signal to a switching element to be in the ON state and output an OFF signal to a switching element to be in the OFF state at a corresponding moment. In response to this control signal, the drive circuit 202 outputs an ON signal or an OFF signal as a drive signal to the control electrode of each switching element.

In the power converter of this embodiment, the silicon carbide semiconductor device of any of the first to fifth embodiments is applied as the switching element in the main converter circuit 201, thereby achieving a low-loss power converter with improved reliability of high-speed switching.

In the example described in this embodiment, the present invention is applied to the two-level three-phase inverter. However, the present invention should not be limited to this inverter but is applicable to various types of power converters. While the two-level power converter is described in this embodiment, a three-level or multilevel power converter is also applicable. For supply of power to a single-phase load, the present invention may be applied to a single-phase inverter. For supply of power to a DC load, for example, the present invention may be applied to a DC/DC converter or an AC/DC converter.

The power converter to which the present invention is applied is not limited to a power converter including a motor as the foregoing load but it may also be used as a power supply device for a discharge machine, a laser machine, an induction heating cooking appliance, or a non-contactor power feeding system, for example. The power converter is further applicable as a power conditioner for a solar power generation system or an electricity storage system, for example.

Explanation of Reference Signs

10 Semiconductor substrate, 20 Drift layer, 21 First separation region, 22 Second separation region, 23 Third separation region, 24 Fourth separation region, 30 First well region, 31 Second well region, 32 Contact region, 33 High-concentration region, 36 Second high-concentration region, 37 JTE region, 40 Source region, 41 Conductive region, 45 Second conductive region, 50 Gate insulating film, 51 Field insulating film, 55 Interlayer insulating film, 60 Gate electrode, 70 Ohmic electrode, 71 First Schottky electrode, 72 Second ohmic electrode, 73 Second Schottky electrode, 74 Third Schottky electrode, 80 Source electrode, source pad, 81 Gate pad, 82 Gate line, 84 Drain electrode, 90 First contact hole, 91 Second contact hole, 92 Third contact hole, 94 Fourth contact hole, 95 Gate contact hole, 100 Power supply, 200 Power converter, 201 Main converter circuit, 202 Drive circuit, 203 Control circuit, 300 Load

The invention claimed is:
1. A silicon carbide semiconductor device comprising:
   a semiconductor substrate of a first conductivity type made of silicon carbide;

a drift layer of the first conductivity type formed on the semiconductor substrate;

multiple first well regions of a second conductivity type provided in a surface layer of the drift layer in a cross-sectional view;

a first separation region of the first conductivity type being a region where the first well regions are separated each other in the cross-sectional view;

a source region of the first conductivity type formed in a surface layer area of the first well region;

a first Schottky electrode provided on the first separation region and forming a Schottky junction with the first separation region;

an ohmic electrode provided on the first well region;

a second well region of the second conductivity type provided in the surface layer of the drift layer separately from the first well region;

a gate insulating film formed on the first well region;

a gate electrode formed on the gate insulating film on the first well region;

a gate pad formed above the second well region and connected with the gate electrode; and a source electrode connected with the first Schottky electrode and the ohmic electrode and not in ohmic connection but in Schottky connection with the second well region.

2. The silicon carbide semiconductor device according to claim 1, wherein
the source electrode and the second well region are in Schottky connection with each other through the second Schottky electrode.

3. The silicon carbide semiconductor device according to claim 1, wherein
the first well region and the second well region are separated.

4. The silicon carbide semiconductor device according to claim 1, wherein
the first well region and the second well region are connected with each other, and
the second well region is separated in a plane direction by a distance exceeding 50 µm from a part where the source electrode and the first well region contact each other.

5. The silicon carbide semiconductor device according to claim 1, further comprising:
a high-concentration region of the second conductivity type formed in a surface layer area of the second well region and having a higher impurity concentration of the second conductivity type than the second well region.

6. The silicon carbide semiconductor device according to claim 1, comprising:
a third separation region of the first conductivity type provided in the second well region; and
a third Schottky electrode provided on the third separation region, connected with the source electrode, and forming Schottky connection with the third separation region.

7. A power converter comprising:
main converter circuit including the silicon carbide semiconductor device according to claim 1, and converting input power and outputting the converted power;
a drive circuit that outputs a drive signal for driving the silicon carbide semiconductor device to the silicon carbide semiconductor device; and
a control circuit that outputs a control signal for controlling the drive circuit to the drive circuit.

8. The silicon carbide semiconductor device according to claim 5, wherein
the high-concentration region is absent below the gate insulating film on which the gate electrode is formed.

9. A silicon carbide semiconductor device comprising:
a semiconductor substrate of a first conductivity type made of silicon carbide;
a drift layer of the first conductivity type formed on the semiconductor substrate;
multiple first well regions of a second conductivity type provided in a surface layer of the drift layer;
a source region of the first conductivity type formed in a surface layer area of the first well region;
a channel epitaxial layer of the first conductivity type formed on a surface of the first well region;
an ohmic electrode provided on the first well region;
a second well region of the second conductivity type provided in the surface layer the drift layer separately from the first well region;
a gate insulating film formed on the first well region;
a gate electrode formed on the gate insulating film on the first well region;
a gate pad formed above the second well region and connected with the gate electrode; and
a source electrode connected with the ohmic electrode and not in ohmic connection but in Schottky connection with the second well region, wherein
the channel epitaxial layer operates as a unipolar diode at a gate voltage being a threshold voltage or less, and the start-up voltage of the unipolar diode is designed to be lower than the operating voltage of a pn diode formed from the first well region and the drift layer.

10. The silicon carbide semiconductor device according to claim 9, wherein
the source electrode and the second well region are in Schottky connection with each other through the second Schottky electrode.

11. The silicon carbide semiconductor device according to claim 9, wherein
the first well region and the second well region are separated.

12. The silicon carbide semiconductor device according to claim 9, wherein
the first well region and the second well region are connected with each other, and
the second well region is separated in a plane direction by a distance exceeding 50 µm from a part where the source electrode and the first well region contact each other.

13. The silicon carbide semiconductor device according to claim 9, further comprising:
a high-concentration region of the second conductivity type formed in a surface layer area of the second well region and having a higher impurity concentration of the second conductivity type than the second well region.

14. The silicon carbide semiconductor device according to claim 9, comprising:
a third separation region of the first conductivity type provided in the second well region; and
a third Schottky electrode provided on the third separation region, connected with the source electrode, and forming Schottky connection with the third separation region.

15. The silicon carbide semiconductor device according to claim 13, wherein the high-concentration region is absent below the gate insulating film on which the gate electrode is formed.

16. A power converter comprising:
a main converter circuit including the silicon carbide semiconductor device according to claim 9, and converting input power and outputting the converted power;
a drive circuit that outputs a drive signal for driving the silicon carbide semiconductor device to the silicon carbide semiconductor device; and
a control circuit that outputs a control signal for controlling the drive circuit to the drive circuit.

* * * * *